United States Patent
Aoki et al.

(10) Patent No.: US 7,985,712 B2
(45) Date of Patent: Jul. 26, 2011

(54) RARE EARTH OXIDE SUPERCONDUCTOR AND PROCESS FOR PRODUCING THE SAME

(75) Inventors: Yuji Aoki, Kawasaki (JP); Yasuo Takahashi, Kawasaki (JP); Takayo Hasegawa, Kawasaki (JP)

(73) Assignees: International Superconductivity Technology Center, The Juridical Foundation, Tokyo (JP); Showa Electric Wire & Cable Co., Ltd., Tokyo (JP)

( * ) Notice: Subject to any disclaimer, the term of this patent is extended or adjusted under 35 U.S.C. 154(b) by 238 days.

(21) Appl. No.: 10/591,449

(22) PCT Filed: Mar. 12, 2004

(86) PCT No.: PCT/JP2004/003264
§ 371 (c)(1),
(2), (4) Date: Sep. 1, 2006

(87) PCT Pub. No.: WO2005/088653
PCT Pub. Date: Sep. 22, 2005

(65) Prior Publication Data
US 2007/0184986 A1  Aug. 9, 2007

(51) Int. Cl.
*H01L 39/24* (2006.01)
*H01L 39/02* (2006.01)

(52) U.S. Cl. .......... 505/237; 505/238; 505/445; 427/62

(58) Field of Classification Search .......... 505/100, 505/237, 238, 445; 427/62
See application file for complete search history.

(56) References Cited

U.S. PATENT DOCUMENTS

| | | | | |
|---|---|---|---|---|
| 4,959,348 A | * | 9/1990 | Higashibata et al. | 505/125 |
| 5,444,040 A | * | 8/1995 | Kojima et al. | 505/238 |
| 6,764,770 B2 | * | 7/2004 | Paranthaman et al. | 428/469 |
| 2004/0157747 A1 | * | 8/2004 | Chen et al. | 505/238 |

OTHER PUBLICATIONS

Giulio, Orta S., International Workshop on Coated Conductors for Applications CCA2003, Program Abstracts, Sep. 12-13, 2003, Italy.
EUCAS 2003 6th European Conference on Applied Superconductivity, Book of Abstracts, Sep. 14-18, 2003, Sorrento Napoli, Italy.
8th IUMRS-ICAM, Abstracts 1, Symposia: Category A & B; Oct. 8-13, 2003, Yokohama, Japan.
16th International Symposium on Superconductivity; Oct. 27-29, 2003; Tsukuba, Japan; pp. 39, 40 & 131.
16th International Symposium on Superconductivity; Oct. 27-29, 2003; Tsukuba, Japan; pp. 45, 46 & 240.
11th Japan-US Workshop on High-Tc Superconductors, Abstracts; Oct. 31-Nov. 2, 2003, Shonan Village Center, Yokosuka, Japan, pp. 4, 87 & 88.
Goyal et al, Recent Progress in the Fabrication of High-$J_c$ tapes by Epitaxial Deposition of YBCO on RABiTS, 2001, pp. 903-913.

* cited by examiner

*Primary Examiner* — Jerry Lorengo
*Assistant Examiner* — Jared Wood
(74) *Attorney, Agent, or Firm* — Bacon & Thomas, PLLC

(57) ABSTRACT

RE superconductive layer excelling in Jc and Tc is formed on an interlayer capable of preventing cracking and diffusion of substrate-constituting Ni element into YBCO layer and excelling in crystallinity and surface smoothness. The interlayer is formed by coating a surface of metal substrate with a mixed solution composed of an organometallic acid salt of cerium, an organometallic acid salt of a solid solution formation element capable of forming a solid solution with cerium and an organometallic acid salt of a charge compensation element capable of compensating for a charge mismatch attributed to a difference between the electron valences of respective ions of cerium and the solid solution formation element and subsequently carrying out heat treatment in a reducing atmosphere of 900 to 1200° C. whose pressure ranges from 0.1 Pa to below atmospheric pressure. Thereafter, a rare earth oxide superconductive layer is formed on the interlayer.

6 Claims, 3 Drawing Sheets

RARE EARTH OXIDE SUPERCONDUCTOR AND PROCESS FOR PRODUCING THE SAME

TECHNICAL FIELD

The present invention relates to an oxide superconductor and a method for producing the same, and, in particular, to a tape-formed rare earth oxide superconductor suitable for applications to such instruments as superconductive magnets and superconductive cables, and an improvement in a method for producing the same.

BACKGROUND ART

Since a rare earth 123 oxide superconductor (RE-123 super conductor) excels in magnetic-field properties at the temperature of liquid nitrogen as compared with a Bi type superconductor, it can realize a practical high critical current density (Jc) in a high magnetic field. Accordingly, if the practical use of a wire material thereof is achieved, in addition to excellent properties at high temperature regions, there is an economically extraordinary advantage because a production method without using silver, which is noble metal, is possible, and, since liquid nitrogen can be used as a refrigeration medium, cooling efficiency is enhanced to several tens to several hundreds times. The result makes it possible to apply a superconductive wire material to instruments, to which the application has been conventionally impossible from the economic perspective. Thus, significant expansion of the application and market of superconductive instruments is foreseen.

RE-123 super conductors (particularly, Y-123 super conductor, Y:Ba:Cu=1:2:3 at mole ratio) has an orthorhombic crystal system. Therefore, in order to make them exert characteristics of the material in conductive characteristics, it is required not only to align CuO planes of the crystal, but also to align in-plane crystal orientations. The reason is that a slight misalignment of orientations creates a twin boundary to lower conductive characteristics.

A manufacturing method of a wire material of the Y-123 super conductor while enhancing in-plane alignment and aligning the in-plane orientation of crystals thereof has the same way as a manufacturing method of a thin film. That is, it is possible to enhance the in-plane alignment degree and orientation of crystals of Y-123 super conductor by forming an intermediate layer having been enhanced in the in-plane alignment degree and the orientation on a tape-formed metal substrate, and using the crystal lattice of the intermediate layer as a template.

Further, it has been proved that Jc of a superconductor depends on crystallinity and surface smoothness of an intermediate layer, and that characteristics thereof changes sensitively and significantly according to conditions of an underlying layer.

With regard to production techniques of above-described biaxially aligned metal substrate in which an in-plain aligned intermediate layer is formed on a tape-formed metal substrate, there are known such methods as an SOE (Surface-Oxidation Epitaxy) method, an ISD (Inclined Substrate Deposition) method, an IBAD (Ion Beam Assisted Deposition) method and a RABiTS (Rolling Assisted Biaxally Textured Substrate) method, and there are many reports about Y-123 superconductive wire materials having a Jc of more than $10^6$ A/cm$^2$ by forming an intermediate layer, whose in-plane alignment degree and orientation have been enhanced, on a non-aligned or aligned metal tape.

Among these, in formation of the intermediate layer in IBAD and RABiTS methods, a vacuum process based on a vapor phase method such as a PLD (Pulse Laser Deposition) method is used, and in the IBAD method, a combination of hastelloy/YSZ/Y$_2$O$_3$, and, on the other hand, in the RABiTS method, a combination of Ni/CeO$_2$/YSZ/CeO$_2$ or the like are generally employed as a biaxially aligned metal substrate, which have such advantage that they can give a dense and smooth intermediate layer film (for example, refer to Non-patent Document 1).

There are many examinations about materials for the intermediate layer. Among these, a CeO$_2$ intermediate layer is known as one of the best intermediate layers since it has a good consistency of crystal lattice with a YBCO layer (Y—Ba—Cu—O superconductive layer) and a low reactivity with a YBCO layer, and many results are reported.

As described above, CeO$_2$ has excellent properties as an intermediate layer when forming a YBCO layer on a metal substrate. However, since a CeO$_2$ film is apt to easily crack because of differences in thermal expansion and the like from a metal substrate and can not be formed in a thick film, an intermediate layer of YSZ (yttrium-stabilized zirconia) or the like must be interposed between a CeO$_2$ film and a metal substrate to form a YBCO layer thereon, as is the case for the RABiTS method.

In order to solve the problem, the present inventors formed an intermediate layer composed of a cerium-based oxide incorporating cerium with 1 type or 2 or more types of rare earth elements, for example, of a solid solution generated between CeO$_2$ and Gd$_2$O$_3$ on a metal substrate by an MOD (Metal Organic Deposition Processes) method, and formed a rare earth oxide superconductive layer (RE superconductive layer) on the intermediate layer, thereby succeeded in forming a RE superconductive layer excelling in superconductive properties on an intermediate layer that can prevent cracking, excels in crystallinity and surface smoothness, and is capable of low temperature synthesis (refer to Japanese Patent Application Nos. 2003-129368 and 2003-129369).

However, it was revealed that a YBCO layer formed on the intermediate layer by an MOD method shows a critical temperature (Tc) lower than the Tc of 90 K fundamentally belonging to a YBCO layer by around 10 K.

This is attributable to diffusion of a Ni element in the substrate into the superconductive layer, thereby substituting for a Cu element constituting the RE-123 super conductor.

Therefore, it was revealed that, although an intermediate layer excelling in lattice consistency, that is, crystallinity and surface smoothness and being capable of preventing cracking can be obtained when forming an intermediate layer of cerium-based oxide incorporating cerium with 1 type or 2 or more types of rare earth elements, for example, Ce—Gd—O by an MOD method as an intermediate layer on a metal substrate, there is a room for improvement as regarding an inhibiting effect on diffusion of an element constituting a substrate.

[Non-patent Document 1] A. Goyal et al., Physica C, 357-360 (2001) 903.

DISCLOSURE OF THE INVENTION

The present invention has been achieved in order to solve the above problem, and it has for its objects to provide a rare earth oxide superconductor (RE superconductor) in which an intermediate layer that is capable of preventing cracking and preventing an element constituting a substrate from diffusing into a superconductive layer and excellent in an in-plane alignment degree and crystallinity such as orientation and smoothness is calcined on a metal substrate, and a RE superconductive layer excelling in Jc and Tc is formed on the intermediate layer; and a method for producing the same.

BEST MODE FOR CARRYING OUT THE INVENTION

In order to accomplish the object, for a RE superconductor as a first embodiment of the present invention, it is intended to form, on the surface of a metal substrate, an intermediate layer constituted by sequentially forming a first intermediate layer composed of cerium and a solid solution formation element capable of forming a solid solution with cerium, and a second intermediate layer composed of a charge compensation element capable of compensating for a charge mismatch attributable to a difference between the electron valences of respective ions of cerium and the solid solution formation element capable of forming the solid solution with cerium, and then form a RE superconductive layer thereon.

Figure 1:
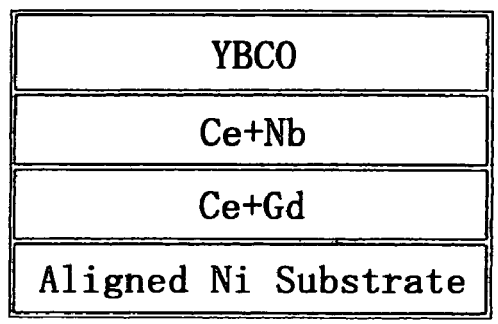
FIG. 1 is a cross-sectional view of the rare earth oxide superconductor according to Example of a first embodiment of the present invention.

The structure of the superconductor in this case is represented, for example, as Ni substrate/Ce—Gd first intermediate layer/Ce—Nb second intermediate layer/YBCO layer, as shown in FIG. 1.

Further, for a RE superconductor as a second embodiment of the invention, it is intended to form the second intermediate layer in the first embodiment with cerium, the solid solution formation element and the charge compensation element.

Figure 2:
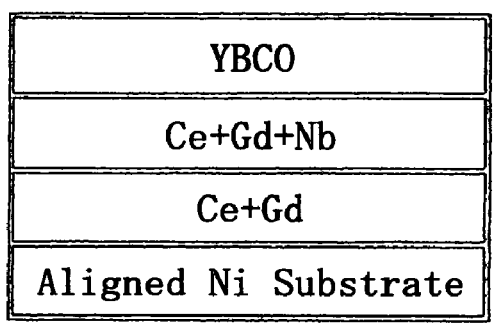
FIG. 2 is a cross-sectional view of the rare earth oxide superconductor according to Example of a second embodiment of the invention.

The structure of the superconductor in this case is represented, for example, as Ni substrate/Ce—Gd first intermediate layer/Ce—Gd—Nb second intermediate layer/YBCO layer, as shown in FIG. 2.

Furthermore, for a RE superconductor as a third embodiment of the invention, it is intended to form an intermediate layer composed of cerium, cerium and the solid solution formation element, and the charge compensation element on the surface of a metal substrate, and then form a RE superconductive layer on the intermediate layer.

Figure 3:
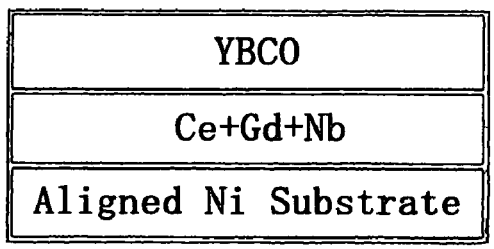
FIG. 3 is a cross-sectional view of the rare earth oxide superconductor according to Example of a third embodiment of the invention.

The structure of the superconductor in this case is represented, for example, as Ni substrate/Ce—Gd—Nb intermediate layer/YBCO layer, as shown in FIG. 3.

In the aforementioned inventions, as the solid solution formation element, any one type or 2 or more types of rare earth elements including Y, Nd, Sm, Gd, Eu, Yb, Ho, Th, Dy, La and Er are used; and, on the other hand, as the charge compensation element, any one type or 2 or more types of elements including Bi, Nb, Sb, Ta and V are used.

The aforementioned RE superconductors are produced according to following methods for producing a RE superconductor, which are a fourth to a sixth embodiments of the invention.

That is, in a method for producing a RE superconductor as a fourth embodiment of the invention, it is intended to form a first coated layer on the surface of a metal substrate by applying a mixed solution composed of an organometallic acid salt of cerium and an organometallic acid salt or salts of any 1 type or 2 or more types of solid solution formation elements capable of forming a solid solution with cerium selected from (Y, Nd, Sm, Gd, Eu, Yb, Ho, Tm, Dy, La and Er), which was then subjected to preliminary calcination, followed by forming a second coated layer on the first coated layer by applying a mixed solution composed of an organometallic acid salt of cerium and an organometallic acid salt or salts of any 1 type or 2 or more types of charge compensation elements capable of compensating for a charge mismatch attributable to a difference between the electron valences of respective ions of cerium and the solid solution formation element selected from (Bi, Nb, Sb, Ta and V), subsequently carrying out heat treatment in a reducing atmosphere under a temperature ranging from 900 to 1200° C. and a pressure ranging from 0.1 Pa to below atmospheric pressure to form an intermediate layer, and then forming a RE superconductive layer on the intermediate layer.

Further, a method for producing a RE superconductor as a fifth embodiment of the invention is intended to form the second coated layer in the fourth embodiment by coating a mixed solution composed of an organometallic acid salt of cerium, an organometallic acid salt or salts of 1 type or 2 or more types of solid solution formation elements selected from the solid solution formation element, and 1 type or 2 or more types of organometallic acid salts of the charge compensation element.

Furthermore, a method for producing a RE superconductor as a sixth embodiment of the invention is intended to form an intermediate layer on the surface of a metal substrate by coating a mixed solution composed of an organometallic acid salt of cerium, cerium and an organometallic acid salt or salts of 1 type or 2 or more types of the solid solution formation element, and an organometallic acid salt or salts of 1 type or 2 or more types of the charge compensation element, and carrying out heat treatment in a reducing atmosphere under a temperature ranging from 900 to 1200° C. and a pressure ranging from 0.1 Pa to below atmospheric pressure.

According to the RE superconductor and the method for producing the same of the invention, by forming an intermediate layer on a metal substrate while using cerium (organometallic acid salt), a solid solution formation element (organometallic acid salt) capable of forming a solid solution with cerium, and a charge compensation element (organometallic acid salt) capable of compensating for a charge mismatch attributable to a difference between electron valences of cerium and the solid solution formation element, and forming a RE superconductive layer on the intermediate layer, it is possible to form an intermediate layer capable of preventing cracking in the intermediate layer and excelling in crystallinity such as an in-plane alignment degree and orientation, and surface smoothness on a metal substrate, and to form a RE superconductive layer excelling in Jc and Tc on the intermediate layer while inhibiting diffusion of an element constituting the substrate.

In the RE superconductor and the method for producing the same according to the invention, an intermediate layer and a rare earth oxide superconductive layer are formed on the surface of a metal substrate, wherein the intermediate layer is required to have a low reactivity with the superconductor, and a small percentage of difference in crystal lattice distances (misfit), and further a function to prevent diffusion of an element of the underlying layer. As a crystalline structure appropriate for the intermediate layer from this viewpoint, any of such crystalline structures as fluorite structure, rare earth-C structure and pyrochlore structure is selected. Further, by forming a solid solution of Ce and a rare earth element, cracking of a conventional $CeO_2$ single layer can be prevented.

In this case, the misfit between the lattice constant 3.88 Å of the a-axis of an Y-123 superconductor crystal and the crystal lattice of the oxide becomes 8% or less, but the misfit varies depending on the composition and is, when possible, desirably 1% or less.

It is desirable that the content of the solid solution formation element in the first intermediate layer of the first and second embodiments of the invention, the content of the charge compensation element in the second intermediate layer of the first embodiment, the total content of the solid solution formation element and the charge compensation element in the second intermediate layer of the second embodiment or the total content of the solid solution formation element and the charge compensation element in the intermediate layer of the third embodiment are 5 to 60 mol % in terms of the metal content, respectively.

It is also desirable that the content of the solid solution formation element in the first coated layer of the fourth and fifth embodiments, the content of the charge compensation element in the second coated layer of the fourth embodiment, the total content of the solid solution formation element and the charge compensation element in the second coated layer of the fifth embodiment or the total content of the solid solution formation element and the charge compensation element in the intermediate layer of the sixth embodiment are, in the same way, 5 to 60 mol % in terms of the metal content, respectively.

Because, in the embodiments, when the content of the solid solution formation element in an intermediate layer or a coated layer of a single layer is less than 5 mol %, the effect on preventing cracking is small; and when the content is more than 60 mol %, the effect as an intermediate layer becomes small because it has an enhanced reactivity with the YBCO layer and the metal substrate. In particular, it is preferable that the addition content of the solid solution formation element is 5 to 40 mol % in terms of the metal content. The solid solution formation element is a rare earth element having a charge of +3, which forms a solid solution with Ce of $CeO_2$ to fulfill a function of lowering the melting point or crystallization temperature in a reaction treatment of crystallization, as well as prevents cracking.

Accordingly, it is desirable that a charge compensation element in an intermediate layer or a coated layer of a single layer is also 5 to 60 mol % in terms of the metal content. The charge compensation element has a charge of +5, and compensates for a charge mismatch created due to a difference between the electro valences of respective ions of Ce and the solid solution formation element and inhibits an ion diffusion in the oxide film.

Further, when the solid solution formation element and the charge compensation element coexist in an intermediate layer or a coated layer of a single layer, a mole ratio of the charge compensation element to the solid solution formation element is desirably charge compensation element/solid solution formation element$\leq 1.2$.

When the intermediate layer is formed in 2 layers, it is necessary to carry out preliminary calcination after coating the first layer, which may be subjected to normal calcination (crystallization heat treatment).

The intermediate layer is formed by calcination in a reducing atmosphere under a pressure ranging from 0.1 Pa to below atmospheric pressure and a temperature ranging from 900 to 1200° C., and, subsequently, a RE superconductive layer is formed on the intermediate layer. In this case, it is more preferable to form the intermediate layer by calcination in a reducing atmosphere under a pressure ranging from 10 to 500 Pa and a temperature ranging from 950 to 1150° C.

Calcination carried out when the pressure is less than 0.1 Pa results in crystallization before epitaxial growth of the film to significantly lower the alignment of an intermediate layer. In particular, calcination in a range of 10 to 500 Pa can lower a heat treatment temperature at the crystallization to make calcination of an intermediate layer at a low temperature of 1000° C. or less possible.

In addition, because, when the calcination temperature of an intermediate layer is a temperature less than 900° C., it becomes difficult to obtain a biaxially aligned film; and a temperature more than 1200° C. results in decomposition of a film at calcination making it difficult to give a targeted oxide.

With regard to a method for producing an intermediate layer, use of many film-forming methods via a liquid phase process is possible, but it is preferable to employ an MOD method from the point of easiness of production and production speed. The MOD method is known as a method of carrying out production by a non-vacuum process. In the case of the present invention, a mixed solution of trifluoroacetate (TFA salt), octylate, naphthenate or the like of cerium, a solid solution formation element and/or a charge compensation element that constitute an intermediate layer at a predetermined mole ratio is coated on a support, which is then subjected to preliminary calcination.

By carrying out calcination of an intermediate layer formed by an MOD method under a reduced pressure described above, crystallization temperature can be lowered, and calcination of an intermediate layer at a low temperature becomes possible. When a metal tape is used as a substrate, this is effective in such point that a diffusion speed of an underlying layer metal element into the inside of the intermediate layer is lowered.

As a metal substrate, such metal tapes can be used as biaxially aligned metal tapes composed of Ni, Ag or alloys of these elements, for example Ni—V or Ni—W alloy, or metal tapes composed of non-aligned Ni, Ag or alloys of these elements, or heat-resistant alloys such as SUS, hastelloy or Inconel.

When forming an intermediate layer directly on a metal substrate composed of Ni, Ni-based alloy or the like, as an atmosphere at calcination, use of a reducing atmospheric gas prepared by adding 0.1 to 10% of $H_2$ to Ar or $N_2$ gas is preferable. Because when a film is formed in an atmosphere of $H_2$ concentration of less than 0.1%, NiO generates on the surface of Ni to significantly block epitaxial growth of the intermediate layer; and, since reducing power of the gas becomes too strong, that of more than 10% results in not giving a targeted oxide.

As described above, it is also possible to dispose an alignment-controlling and diffusion-preventing layer of 0.2 μm or less formed by using a vapor phase process such as a PLD method or a sputtering method between an intermediate layer formed by an MOD method and a metal tape. Further, it is also effective to carry out film-forming a $CeO_2$, Ce—RE-O film of 0.2 μm or less on an intermediate layer manufactured by an MOD method as a CAP layer.

The repetition number of coating a precursor film of an intermediate layer on a metal substrate formed by an MOD method is not restricted in any way and, in order to obtain a designed film thickness, it is also possible to employ a procedure in which a coating-preliminary calcination (drying) treatment is carried out more than once. In other words, independently of the repetition number of coating, it is sufficient when the charge balance in the formed precursor film of an intermediate layer is compensated for.

With regard to a method for forming a superconductive layer on the intermediate layer thus formed on a metal substrate, it is possible to form it according to various methods including physical evaporation methods such as a pulse laser deposition (PLD) method and an e-beam evaporation, gas phase processes such as a chemical evaporation method including a chemical vapor deposition (CVD) method, and a film-forming method via a liquid phase process such as an MOD method as is the case with an intermediate layer.

In particular, the intermediate layer according to the present invention is remarkably effective in a method, among the methods for forming a superconductive layer, in which film-forming of a precursor of TFA subjected to preliminary calcination (TFA-MOD method), or film-forming of a F-containing precursor by an e-beam or PLD method (ex-situ method) on a tape surface is carried out followed by normal calcination to form a YBCO film. In these processes, since the precursor film contains F and water vapor is used at calcination, HF generates at preliminary calcination and normal calcination, and, accordingly, acid resistance is required for an intermediate layer. On this occasion, since the intermediate layer according to the present invention is of a Ce-based oxide, it excels in acid resistance.

Further, since the intermediate layer in the present invention can prevent cracking, it can be formed in an increased thickness, which makes it unnecessary to form a multi-layer structured intermediate layer as is the case for the RABiTS method, and makes it possible to form a rare earth oxide superconductive layer directly on a cerium-based oxide layer.

(Formation of an Intermediate Layer and a YBCO Layer According to an MOD Method)

An aligned Ni substrate was used as a substrate, on which an intermediate layer film and a YBCO film were formed by an MOD method.

Solutions of various organometallic compounds having a metal concentration of 0.2 mol/L were prepared as raw materials, each of which was coated on a substrate having a size of 10 mm×5 mm by a spin coating method to form a coated film. The rotation speed at that time was 3000 rpm. The substrate coated with the precursor film of an intermediate layer film was subjected to preliminary calcination and drying in an Ar—$H_2$ (2%) atmosphere, and further subjected to calcination in a reducing atmosphere to form an intermediate layer film on the substrate.

After forming the intermediate layer film on the substrate, a YBCO layer was film-formed on the intermediate layer film by a TFA-MOD method, which was then subjected to a heat treatment of 750° C.×1 hour in an oxidizing atmosphere to produce a superconductor.

EXAMPLE 1

A mixed solution of naphthenates of Ce:Gd=7:3 at mole ratio was used as a raw material solution, which was coated on a substrate, and then subjected to preliminary calcination at 300° C. to form a first intermediate layer. Subsequently, on the first intermediate layer was coated a mixed solution of naphthenates of Ce:Nb=7:3 at mole ratio, and then subjected to a heat treatment of 1000° C.×1 hour in a reducing atmosphere of Ar-2% $H_2$ at a pressure of 10 Pa to form an intermediate layer. On the intermediate layer, a YBCO layer was formed by a TFA-MOD method.

The YBCO film manufactured on the intermediate layer showed a critical temperature (Tc) of from 85 to 88 K.

EXAMPLE 2

A mixed solution of naphthenates of Ce:Gd=6:4 at mole ratio was used as a raw material solution, which was coated on a substrate, and then subjected to preliminary calcination at 300° C. to form a first intermediate layer. Subsequently, on the first intermediate layer was coated a mixed solution of naphthenates of Ce:Gd:Nb=6:2:2 at mole ratio, which was subjected to a heat treatment of 1000° C.×1 hour in a reducing atmosphere of Ar-2% $H_2$ at a pressure of 20 Pa to form an intermediate layer. On the intermediate layer, a YBCO layer was formed by a TFA-MOD method.

The YBCO film manufactured on the intermediate layer showed a critical temperature (Tc) of from 85 to 88 K.

EXAMPLE 3

A mixed solution of naphthenates of Ce:Gd:Nb=90:5:5 at mole ratio was used as a raw material solution, which was coated on a substrate, and then subjected to preliminary calcination at 300° C., and subsequently, a mixed solution of naphthenates of Ce:Gd:Nb=70:20:10 at mole ratio was coated thereon, which was subjected to a heat treatment of 1000° C.×1 hour in a reducing atmosphere of Ar-2% $H_2$ at a pressure of 500 Pa to form an intermediate layer. On the intermediate layer, a YBCO layer was formed by a TFA-MOD method.

The in-plain alignment of the obtained intermediate layer film slightly depended on the preliminary calcination condition and showed a FWHM ranging form 8 to 10 degrees. The YBCO film manufactured on the intermediate layer showed a critical temperature (Tc) of 88 K.

EXAMPLE 4

A mixed solution of naphthenates of Ce:Gd=90:10 at mole ratio was used as a raw material solution, which was coated on a substrate, and then subjected to preliminary calcination at 300° C. to form a first intermediate layer. Subsequently, on the first intermediate layer was coated a mixed solution of naphthenates of Ce:Gd:Nb=70:20:10 at mole ratio, which was subjected to a heat treatment of 1000° C.×1 hour in a reducing atmosphere of Ar-2% $H_2$ at a pressure of 500 Pa to form an intermediate layer. On the intermediate layer, a YBCO layer was formed by a TFA-MOD method.

The YBCO film formed on the intermediate layer showed a critical temperature (Tc) of 88 K and a critical current density (Jc) of 0.3 MA/$cm^2$. Further, the intermediate layer showed a FWHM of 7.6 degrees, and the YBCO layer showed a FWHM of 8.4 degrees, which means a good degree of alignment.

Figure 4:
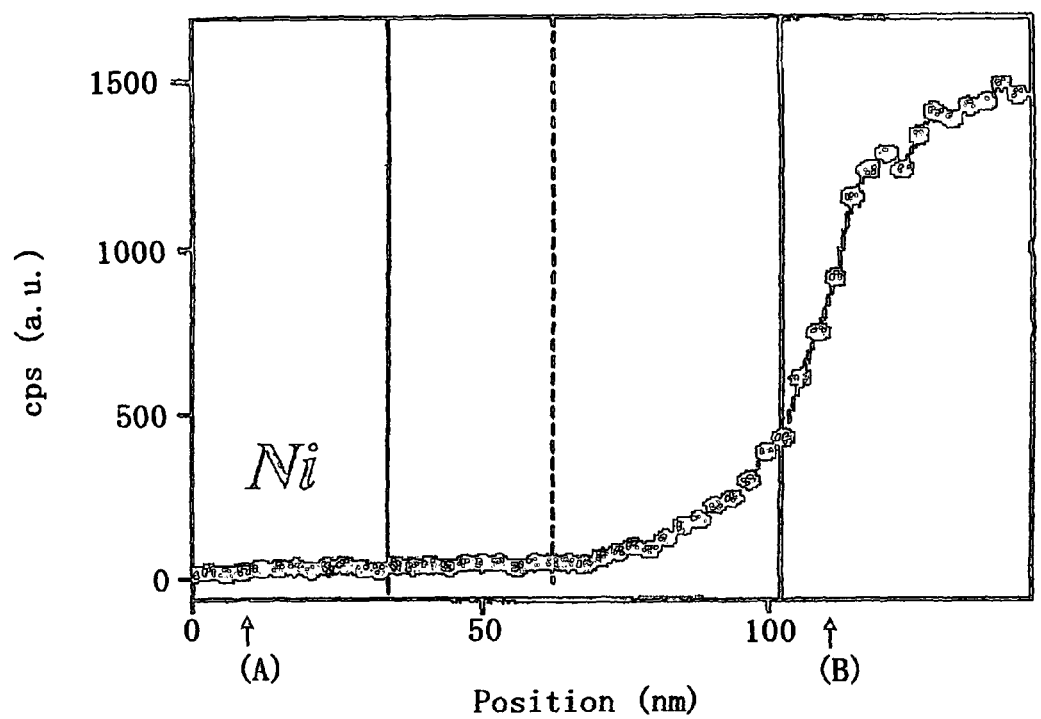
FIG. 4 is a graph showing the distribution of Ni element at the cross-section of the rare earth oxide superconductor of Example of the second embodiment of the invention.
Figure 5:
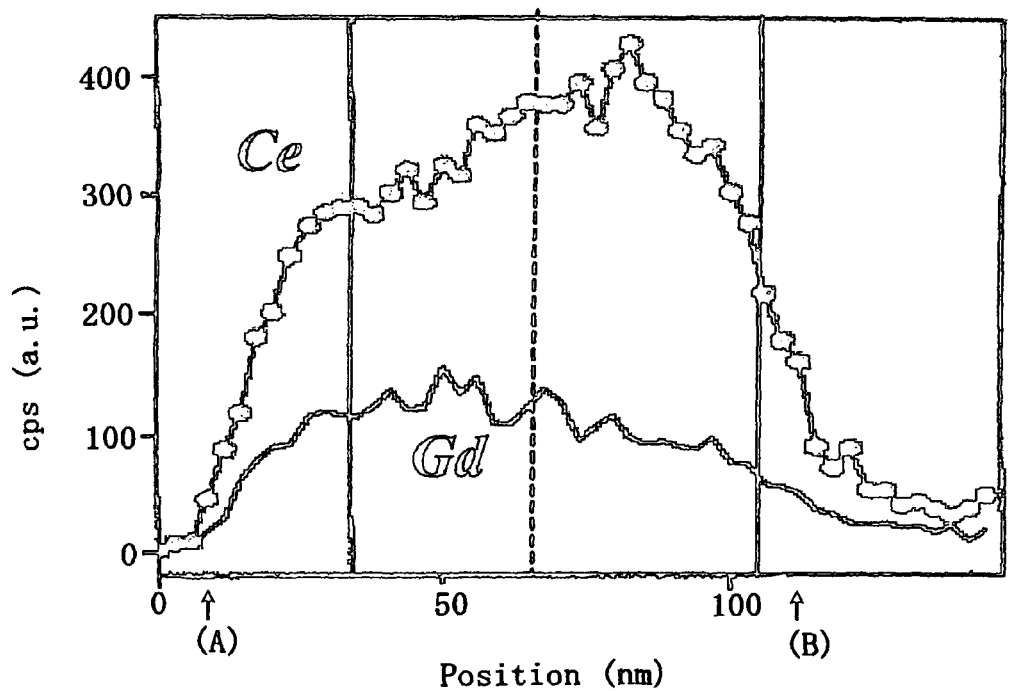
FIG. 5 is a graph showing the distribution of Ce element and Gd elements at the cross-section of the rare earth oxide superconductor of Example of the second embodiment of the invention.
Figure 6:
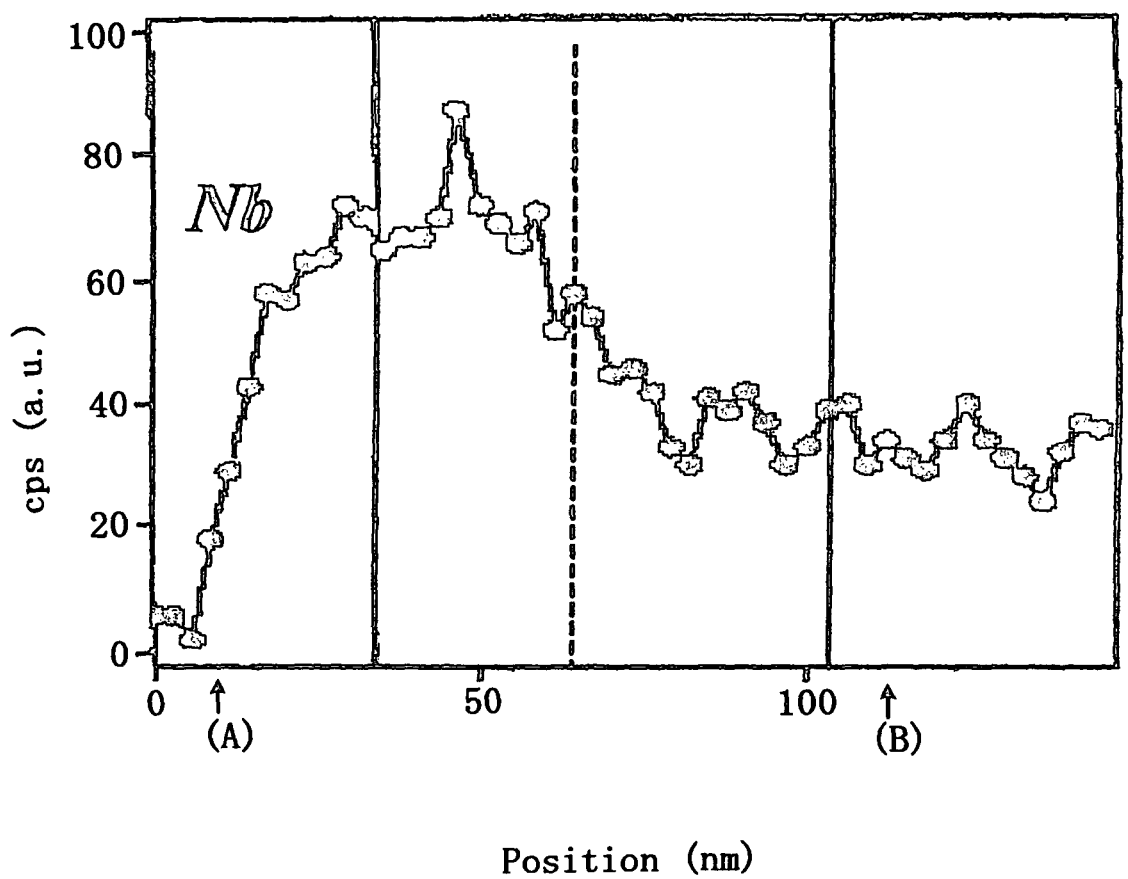
FIG. 6 is a graph showing the distribution of Nb element at the cross-section of the rare earth oxide superconductor of Example of the second embodiment of the invention.

Distribution of elements added in the intermediate layer thus formed is shown in FIGS. 4-6. Here, (A) denotes the position on the intermediate layer surface and (B) denotes the position on the Ni substrate surface.

As is clear from these drawings, by forming an intermediate layer having a two-layer structure of Ce—Gd/Ce—Gd—Nb, it is possible to prevent diffusion of a Ni element constituting a substrate into a YBCO layer, it becomes possible to give an intermediate layer and YBCO layer having a good degree of alignment, and, as the result, it is possible to produce a superconductor having an excellent superconductive properties.

COMPARATIVE EXAMPLE 1

A mixed solution of naphthenates of Ce:Gd:O=60:20:20 at mole ratio was prepared and coated on a substrate, which was subjected to preliminary calcination at 300° C., and then subjected to normal calcination of 1000° C.×1 hour in a reducing atmosphere of Ar-2% $H_2$ at a pressure of 20 Pa.

A YBCO film formed on the intermediate layer by a TFA-MOD method showed a critical temperature (Tc) of 80 K, which was lower than 90 K as the physical property value of YBCO superconductor by 10 K.

COMPARATIVE EXAMPLE 2

A mixed solution of naphthenates of Ce:Gd:O=90:5:5 at mole ratio was prepared and coated on a substrate, which was subjected to preliminary calcination at 300° C., and then subjected to normal calcination of 1000° C.×1 hour in a reducing atmosphere of Ar-2% $H_2$ at a pressure of 20 Pa.

A YBCO film formed on the intermediate layer by a TFA-MOD method showed a critical temperature (Tc) of 70 K, which was lower than 90 K as the physical property value of YBCO superconductor by 20 K.

As is clear from the Examples and Comparative examples, when Nb as a charge compensation element is not added to cerium, Tc is 70-80 K; on the contrary, when Nb as a charge compensation element is added to Gd as a solid solution formation element, Tc is wholly improved such as 85-88 K. This result is thought to be attributable to compensation of a deficiency of charge caused by addition of a solid solution formation element to lower ion diffusion in the intermediate layer, thereby preventing a Ni element from diffusing into a superconductive layer.

INDUSTRIAL APPLICABILITY

The rare earth oxide superconductor according to the present invention is useful for a tape-formed rare earth oxide superconductor suitable for use in instruments such as superconductive magnets and superconductive cables.

The invention claimed is:

1. A rare earth oxide superconductor comprising:
   a metal substrate;
   an intermediate layer formed on the surface of the metal substrate by sequentially disposing:
      a first intermediate cerium-based oxide layer consisting essentially of cerium and one or more solid solution formation elements, selected from the group consisting of Y, Nd, Sm, Gd, Eu, Yb, Ho, Tm, Dy, La and Er, which are capable of forming a solid solution with cerium, and
      a second intermediate cerium-based oxide layer, different from the first intermediate cerium-based oxide layer and consisting essentially of cerium and one or more charge compensation elements, selected from the group consisting of Bi, Nb, Sb, Ta and V, which are capable of compensating for a charge mismatch attributable to a difference between the electron valences of respective ions of cerium and the solid solution formation element, wherein the total of the solid solution formation element and the charge compensation element in the intermediate layers is 5 to 60 mol % in terms of the metal content; and
   a rare earth oxide superconductive layer formed on the intermediate layer and having a critical temperature (Tc) of 85-88° K.

2. The rare earth oxide superconductor according to claim 1, wherein the metal substrate is a biaxially aligned metal substrate.

3. The rare earth oxide according to claim 1 wherein the solid solution formation element is Gd and the charge compensation element is Nb.

4. A method for producing a rare earth oxide superconductor comprising the steps of:
   applying a mixed solution, on the surface of a metal substrate, consisting essentially of an organometallic acid salt of cerium and an organometallic acid salt of one or more solid solution formation elements, selected from the group consisting of Y, Nd, Sm, Gd, Eu, Yb, Ho, Tm, Dy, La and Er, which are capable of forming a solid solution with cerium, and then preliminarily calcining the same to form a first cerium-based oxide intermediate layer;
   applying a mixed solution, on the first cerium-based oxide intermediate layer, consisting essentially of an organometallic acid salt of cerium and an organometallic acid salt of one or more of a charge compensation element, selected from the group consisting of Bi, Nb, Sb, Ta and V, which are capable of compensating for a charge mismatch attributable to a difference between the electron valences of respective ions of cerium and the solid solution formation element, to form a second cerium-based oxide intermediate layer, wherein the total of the solid solution formation element and the charge compensation element in the intermediate layers is 5 to 60 mol % in terms of the metal content, followed by a heat treatment in a reducing atmosphere under a pressure ranging from 0.1 Pa to below atmospheric pressure and a temperature in a range from 900 to 1200° C. to form a cerium-based oxide intermediate layer including the first and second cerium-based oxide intermediate layers; and then
   forming by an MOD method a rare earth oxide superconductive layer on the intermediate layer.

5. The method for producing a rare earth oxide superconductor according to claim 4, wherein the cerium-based oxide intermediate layer is formed by calcination in a reducing atmosphere under a pressure in a range from 10 to 500 Pa and a temperature ranging from 950 to 1150° C.

6. The method for producing a rare earth oxide superconductor according to claim 4 wherein the solid solution formation element is Gd and the charge compensation element is Nb.

* * * * *